US012341105B2

(12) United States Patent
Koi et al.

(10) Patent No.: US 12,341,105 B2
(45) Date of Patent: Jun. 24, 2025

(54) SEMICONDUCTOR DEVICE

(71) Applicant: SHINKO ELECTRIC INDUSTRIES CO., LTD., Nagano (JP)

(72) Inventors: Kenichi Koi, Nagano (JP); Hitoshi Ito, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 472 days.

(21) Appl. No.: 17/983,531

(22) Filed: Nov. 9, 2022

(65) Prior Publication Data

US 2023/0145565 A1    May 11, 2023

(30) Foreign Application Priority Data

Nov. 11, 2021  (JP) ................... 2021-183970
Jul. 21, 2022   (JP) ................... 2022-116626

(51) Int. Cl.
*H01L 23/538*    (2006.01)
*H01L 21/48*     (2006.01)
(Continued)

(52) U.S. Cl.
CPC ...... *H01L 23/5387* (2013.01); *H01L 21/4853* (2013.01); *H01L 23/49811* (2013.01);
(Continued)

(58) Field of Classification Search
CPC .............. H01L 23/5387; H01L 23/4911; H01L 23/5385; H01L 23/5386; H01L 24/05;
(Continued)

(56) References Cited

U.S. PATENT DOCUMENTS

2002/0114143 A1   8/2002  Morrison et al.
2005/0026328 A1   2/2005  Watanabe
(Continued)

FOREIGN PATENT DOCUMENTS

EP    1 162 719 A2   12/2001
EP    2 259 313 A1   12/2010
(Continued)

OTHER PUBLICATIONS

Extended European Search Report dated Mar. 24, 2023 issued in corresponding European application No. 22 20 6718; English text (10 pages).

*Primary Examiner* — Jasmine J Clark
(74) *Attorney, Agent, or Firm* — Rankin, Hill & Clark LLP (57) ABSTRACT

A semiconductor device includes: a first semiconductor element including a first face and a second face; a second semiconductor element including a third face and a fourth face; an insulating base member including a fifth face and a sixth face; a first wiring that penetrates through the insulating base member, and is disposed on the sixth face; a second wiring that penetrates through the insulating base member, and is disposed on the sixth face; a first wiring member that faces the second face; and a second wiring member that faces the sixth face, and is electrically connected to the second wiring. The second wiring member is bonded to the first and second wirings while the insulating base member is folded. A current flows in a first direction in the first wiring member, and flows in a second direction opposite to the first direction in the second wiring member.

14 Claims, 10 Drawing Sheets

(51) Int. Cl.
  *H01L 23/00* (2006.01)
  *H01L 23/495* (2006.01)
  *H01L 23/498* (2006.01)
  *H01L 25/00* (2006.01)
  *H01L 25/07* (2006.01)

(52) U.S. Cl.
  CPC ...... *H01L 23/5385* (2013.01); *H01L 23/5386* (2013.01); *H01L 24/05* (2013.01); *H01L 24/06* (2013.01); *H01L 24/29* (2013.01); *H01L 24/32* (2013.01); *H01L 24/33* (2013.01); *H01L 24/40* (2013.01); *H01L 24/73* (2013.01); *H01L 24/83* (2013.01); *H01L 24/92* (2013.01); *H01L 25/074* (2013.01); *H01L 25/50* (2013.01); H01L 23/495 (2013.01); H01L 2224/05573 (2013.01); H01L 2224/05582 (2013.01); H01L 2224/05583 (2013.01); H01L 2224/05584 (2013.01); H01L 2224/05624 (2013.01); H01L 2224/05644 (2013.01); H01L 2224/05647 (2013.01); H01L 2224/05655 (2013.01); H01L 2224/05664 (2013.01); H01L 2224/0603 (2013.01); H01L 2224/06181 (2013.01); H01L 2224/2919 (2013.01); H01L 2224/29191 (2013.01); H01L 2224/32225 (2013.01); H01L 2224/33181 (2013.01); H01L 2224/33505 (2013.01); H01L 2224/40101 (2013.01); H01L 2224/40225 (2013.01); H01L 2224/73263 (2013.01); H01L 2224/83191 (2013.01); H01L 2224/83192 (2013.01); H01L 2224/8392 (2013.01); H01L 2224/83986 (2013.01); H01L 2224/92246 (2013.01); H01L 2924/0665 (2013.01); H01L 2924/07025 (2013.01); H01L 2924/0715 (2013.01)

(58) Field of Classification Search
  CPC ......... H01L 24/06; H01L 24/29; H01L 24/32; H01L 24/33; H01L 24/40; H01L 24/73; H01L 24/83; H01L 24/92; H01L 25/074; H01L 25/50
  USPC .......................................................... 257/774
  See application file for complete search history.

(56) References Cited

U.S. PATENT DOCUMENTS

| | | |
|---|---|---|
| 2006/0043562 A1 | 3/2006 | Watanabe |
| 2006/0124347 A1 | 6/2006 | Takaike |
| 2016/0056136 A1 | 2/2016 | McConnelee et al. |
| 2017/0250093 A1 | 8/2017 | McConnelee et al. |
| 2018/0082857 A1 | 3/2018 | McConnelee et al. |
| 2019/0067251 A1 | 2/2019 | Bando et al. |
| 2023/0145182 A1* | 5/2023 | Ito .................. H01L 25/074 257/690 |

FOREIGN PATENT DOCUMENTS

| | | |
|---|---|---|
| EP | 2 323 245 A1 | 5/2011 |
| JP | 2015-228529 A | 12/2015 |
| JP | 2016-046523 | 4/2016 |
| KR | 10-2018-0023365 A | 3/2018 |

* cited by examiner

SEMICONDUCTOR DEVICE

This application claims priority from Japanese Patent Applications No. 2021-183970, filed on Nov. 11, 2021, and No. 2022-116626, filed on Jul. 21, 2022, the entire contents of which are herein incorporated by reference.

BACKGROUND

Technical Field

The present disclosure relates to a semiconductor device.

Background Art

There has been known a semiconductor device in which each of semiconductor elements is attached to a film of a resin such as polyimide through an adhesive layer and a wiring layer is formed on a face of the resin film on an opposite side to the adhesive layer (see e.g. JP-A-2016-046523).

On the other hand, further reduction of inductance generated in the semiconductor device is desired in order to achieve high-speed switching operation, etc. of the semiconductor device.

The present disclosure aims to provide a semiconductor device capable of reducing inductance.

SUMMARY

A certain embodiment provides a semiconductor device. The semiconductor device includes: a first semiconductor element including a first face and a second face opposite to the first face, wherein a first electrode is provided in the first face and a second electrode is provided in the second face; a second semiconductor element including a third face and a fourth face opposite to the third face, wherein a third electrode is provided in the third face and a fourth electrode is provided in the fourth face; an insulating base member including a fifth face and a sixth face opposite to the fifth face, wherein the first face of the first semiconductor element and the third face of the second semiconductor element are adhesively bonded to the fifth face; a first wiring that penetrates through the insulating base member to be electrically connected to the first electrode, and that is disposed on the sixth face of the insulating base member; a second wiring that penetrates through the insulating base member to be electrically connected to the third electrode, and that is disposed on the sixth face of the insulating base member; a first wiring member that faces the second face of the first semiconductor element, and that is electrically connected to the second electrode; and a second wiring member electrically connected to the second wiring and including a seventh face and an eighth face opposite to the seventh face, wherein the seventh face of the second wring member faces the sixth face of the insulating base member. The second wiring member is bonded to both the first wiring and the second wiring in a state where the insulating base member is folded. The first wiring member and the second wiring member face each other, and are electrically connected to each other. A current flows in a first direction in the first wiring member, and flows in a second direction opposite to the first direction in the second wiring member.

DESCRIPTION OF EMBODIMENTS

Embodiments of the present disclosure will be described below specifically with reference to the accompanying drawings. Incidentally, in the description of the present disclosure and the drawings, constituent elements that have substantially the same functional configurations will be designated by the same reference signs correspondingly and respectively, and duplicated explanation about these constituent elements may be therefore omitted. In addition, in the present disclosure, an X1-X2 direction, a Y1-Y2 direction and a Z1-Z2 direction are set as directions mutually orthogonal to one another. A plane including the X1-X2 direction and the Y1-Y2 direction will be described as XY plane, a plane including the Y1-Y2 direction and the Z1-Z2 direction will be described as YZ plane, and a plane including the Z1-Z2 direction and the X1-X2 direction will be described as ZX plane. Incidentally, for convenience, the Z1-Z2 direction will be set as an up-down direction, with the Z1 side being an upper side and the Z2 side being a lower side. In addition, the term "plan view" will mean a view of an object from the Z1 side, and the term "planar shape" will mean the shape of the object viewed from the Z1 side. However, a semiconductor device can be used in a vertically inverted state, or can be disposed at any angle.

First Embodiment

First, a first embodiment will be described. The first embodiment relates to a semiconductor device.

[Configuration of Semiconductor Device]

Figure 1:
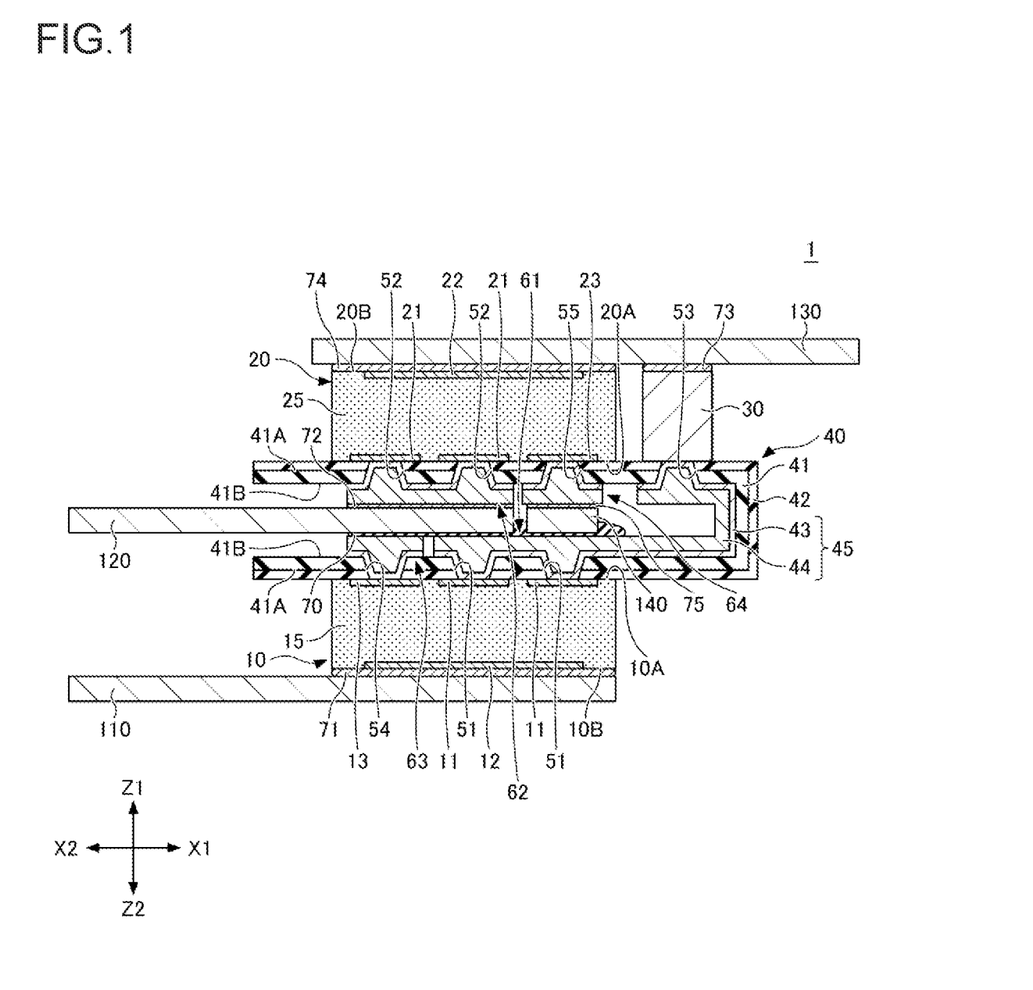
FIG. 1 is a sectional view showing a semiconductor device according to a first embodiment.

First, a sectional configuration of the semiconductor device according to the first embodiment will be described. FIG. 1 is a sectional view showing the semiconductor device according to the first embodiment.

As shown in FIG. 1, the semiconductor device 1 according to the first embodiment has a semiconductor element 10, a semiconductor element 20, an electrically conductive member 30, and a flexible wiring substrate 40. For example, a device using silicon (Si) or silicon carbide (SiC) can be used as each of the semiconductor elements 10 and 20. For example, a device using gallium nitride (GaN), gallium arsenide (GaAs) etc. also can be used as the semiconductor element 10, 20. For example, a semiconductor element acting as an active element (e.g. a silicon chip such as a CPU), an insulated gate bipolar transistor (IGBT), a metal-oxide-semiconductor field-effect transistor (MOSFET), a diode, etc. can be used as the semiconductor element 10, 20. The semiconductor element 10, 20 according to the present embodiment is a semiconductor element which includes electrodes provided in its front and back faces. The semiconductor element 10, 20 can be set to have any shape and any size in terms of the planar shape. The semiconductor element 10, 20 is, for example, formed into a rectangular shape in terms of the planar shape. Thickness of the semiconductor element 10, 20 can be, for example, set in a range of about 50 µm to 500 µm.

The semiconductor element 10 has one face 10A, and the other face 10B located on an opposite side to the face 10A. In addition, the semiconductor element 10 has a body portion 15, electrodes 11, an electrode 12, and an electrode 13. The electrodes 11 and the electrode 13 are provided in the face 10A, and the electrode 12 is provided in the other face 10B. For example, the electrodes 11, the electrode 12, and the electrode 13 can be set as source electrodes, a drain electrode, and a gate electrode, respectively.

The semiconductor element 20 has one face 20A, and the other face 20B located on an opposite side to the face 20A. In addition, the semiconductor element 20 has a body portion 25, electrodes 21, an electrode 22, and an electrode 23. The electrodes 21 and the electrode 23 are provided in the face 20A, and the electrode 22 is provided in the other face 20B. For example, the electrodes 21, the electrode 22, and the electrode 23 can be set as source electrodes, a drain electrode, and a gate electrode, respectively.

For example, any of metals such as aluminum (Al) and copper (Cu), or an alloy containing at least one metal selected from these metals can be used as the material of the electrodes 11, the electrode 12, the electrode 13, the electrodes 21, the electrode 22, and the electrode 23 (which may be hereinafter generically referred to as "electrodes"). Incidentally, if occasions demand, a surface treatment layer may be formed on each of surfaces of the electrodes. Examples of the surface treatment layer include a gold (Au) layer, a nickel (Ni) layer/Au layer (a metal layer in which the Ni layer and the Au layer are deposited in the named order), an Ni layer/palladium (Pd) layer/Au layer (a metal layer in which the Ni layer, the Pd layer, and the Au layer are deposited in the named order), etc. For example, a metal layer formed by an electroless plating method (an electroless plated metal layer) can be used as each of the Au layer, the Ni layer, and the Pd layer. In addition, the Au layer is a metal layer made of Au or an Au alloy, and the Ni layer is a metal layer made of Ni or an Ni alloy, and the Pd layer is a metal layer made of Pd or a Pd alloy.

The electrically conductive member 30 is, for example, a metal plate such as a Cu plate. The electrically conductive member 30 can be set to have any shape and any size in terms of the planar shape. The electrically conductive member 30 is, for example, formed into a rectangular shape in terms of the planar shape. Thickness of the electrically conductive member is comparable to the thickness of the semiconductor element 10, 20. The thickness of the electrically conductive member 30 can be, for example, set in a range of about 50 µm to 500 µm.

The flexible wiring substrate 40 has an insulating base member 41, an insulating adhesive layer 42, and a wiring layer 45. The insulating base member 41 has one face 41A, and the other face 41B located on an opposite side to the face 41A. The adhesive layer 42 is provided on the face 41A, and the wiring layer 45 is provided on the other face 41B. The adhesive layer 42 may be provided on the entire face 41A. The wiring layer 45 is deposited on the other face 41B. The wiring layer 45 has a seed layer 43 and a metal layer 44.

For example, a resin film etc. can be used as the insulating base member 41. An insulating resin such as a polyimide-based resin, a polyethylene-based resin or an epoxy-based resin can be used as the material of the resin film. The insulating base member 41 has, for example, flexibility. Here, the term "flexibility" means a property of being able to be bent or flexed. The insulating base member 41 can be set to have any shape and any size in terms of the planar shape. The insulating base member 41 is, for example, formed into a rectangular shape in terms of the planar shape. Thickness of the insulating base member 41 can be, for example, set in a range of about 50 µm to 100 µm.

The semiconductor element 10, the semiconductor element 20, and the electrically conductive member 30 are adhesively bonded to the face 41A of the insulating base member 41 by the adhesive layer 42. The face 10A of the semiconductor element 10 and the face 20A of the semiconductor element 20 face the face 41A of the insulating base member 41. Through holes 51 where the electrodes 11 are exposed, through holes 52 where the electrodes 21 are exposed, a through hole 53 where the electrically conductive member 30 is exposed, a through hole 54 where the electrode 13 is exposed, and a through hole 55 where the electrode 23 is exposed are formed in the insulating base member 41 and the adhesive layer 42.

As the material of the adhesive layer 42, for example, an adhesive agent such as an epoxy-based adhesive agent, a polyimide-based adhesive agent, or a silicone-based adhesive agent can be used. Thickness of the adhesive layer 42 can be, for example, set in a range of about 20 µm to 40 µm.

Pairs of the electrodes 11 and the through holes 51 may be provided, and pairs of the electrodes 21 and the through holes 52 may be provided.

The wiring layer 45 has a wiring 61 connected to the electrodes 11 through the through holes 51, a wiring 62 connected to the electrodes 21 through the through holes 52, a wiring 63 connected to the electrode 13 through the through hole 54, and a wiring 64 connected to the electrode 23 through the through hole 55. The wiring 61 is also connected to the electrically conductive member 30 through the through hole 53.

The wiring 61 includes via wirings filled in the through holes 51, a via wiring filled in the through hole 53, and a wiring pattern formed on the other face 41B of the insulating base member 41. The wiring 62 includes via wirings filled in the through holes 52, and a wiring pattern formed on the other face 41B of the insulating base member 41. The wiring 63 includes a via wiring filled in the through hole 54, and a wiring pattern formed on the other face 41B of the insulating base member 41. The wiring 64 includes a via wiring filled in the through hole 55, and a wiring pattern formed on the other face 41B of the insulating base member 41.

The seed layer 43 covers the other face 41B of the insulating base member 41 and inner faces of the through holes 51 to 55. The seed layer 43 is formed to continuously cover the other face 41B of the insulating base member 41, the inner faces of the through holes 51 and 55, and faces of the electrodes exposed at the bottoms of the through holes 51 to 55. A metal film (sputtered film) formed by a sputtering method can be used as the seed layer 43. For example, a metal layer with a two-layer structure in which a titanium (Ti) layer made of Ti and a copper (Cu) layer made of Cu are sequentially deposited on the other face 41B of the insulating base member 41 and the inner faces of the through holes 51 to 55 can be used as the seed layer 43 formed by the sputtering method. In this case, thickness of the Ti layer can be, for example, set in a range of about 10 nm to 300 nm, and thickness of the Cu layer can be, for example, set in a range of about 100 nm to 1000 nm. Incidentally, the Ti layer functions as a close contact layer that improves close contact of the seed layer 43 with the insulating base member 41 and the electrodes etc. In addition, the Ti layer also functions as a metal barrier layer that restrains copper from diffusing from the Cu layer etc. into the insulating base member 41 etc. In addition to the Ti, titanium nitride (TiN), tantalum nitride (TaN), tantalum (Ta), chrome (Cr), etc. can be used as the material of such a metal film functioning as the close contact layer and the metal barrier layer.

For example, copper or a copper alloy can be used as the material of the metal layer 44. For example, a metal layer formed by an electrolytic plating method (an electrolytic plated metal layer) can be used as the metal layer 44.

The flexible wiring substrate 40 is folded with the face 41A facing outside and the other face 41B facing inside. Specifically, the flexible wiring substrate 40 is folded so that the through holes 52, 53 and 55 are positioned on an upper side (Z1 side) of the through holes 51 and 54. Therefore, the wirings 62 and 64 of the wiring layer 45 are positioned on an upper side (Z1 side) of the wiring 63, and the wiring 61 is folded in the middle. Moreover, the semiconductor element 10 and the semiconductor element 20 are overlapped with each other in the Z1-Z2 direction. The semiconductor element 20 is positioned on an upper side (Z1 side) of the semiconductor element 10, and the face 10A of the semiconductor element 10 and the face 20A of the semiconductor element 20 face each other. The flexible wiring substrate 40 is folded thus to thereby have a bent portion.

For example, in the state in which the flexible wiring substrate 40 is folded, the electrodes 1 and the through holes 51 are positioned on an X1 side of the electrode 13, and the electrodes 21 and the through holes 54 are positioned on an X2 side of the electrode 23 and the through hole 55. Moreover, the electrically conductive member 30 and the through hole 53 are positioned on an X1 side of the semiconductor element 20 and the through hole 55.

The semiconductor device 1 further has a lead terminal 110, a lead terminal 120, a lead terminal 130, and a lead terminal 140. Each of the lead terminals 110, 120, 130, and 140 is, for example, formed from a lead frame. The lead terminal 110, 120, 130 is an example of a wiring member.

The lead terminal 110 is bonded to the electrode 12 of the semiconductor element 10 by an electrically conductive adhesive layer 71. The lead terminal 120 is bonded to the wiring 62 of the wiring layer 45 by an electrically conductive adhesive layer 72. The lead terminal 130 is bonded to the electrically conductive member 30 by an electrically conductive adhesive layer 73, and bonded to the electrode 22 of the semiconductor element 20 by an electrically conductive adhesive layer 74. The lead terminal 140 is bonded to the wiring 64 of the wiring layer 45 by an electrically conductive adhesive layer 75. The electrically conductive adhesive layers 71 to 75 are, for example, solder layers or sintered metal layers. The electrically conductive adhesive layers 71 to 75 may be made of an electrically conductive paste.

The lead terminals 120 and 140 are bonded to the wirings 61 and 63 of the wiring layer 45 by an insulating adhesive layer 70. For example, an adhesive agent such as an epoxy-based adhesive agent, a polyimide-based adhesive agent, or a silicone-based adhesive agent can be used as the material of the insulating adhesive layer 70. The semiconductor elements 10 and are fixed to each other through the insulating adhesive layer 70.

The lead terminal 110 and the lead terminal 120 face each other in the Z1-Z2 direction, and are electrically connected to each other.

The lead terminals 110 and 120 extend in parallel with each other toward the X2 side as viewed from the semiconductor elements 10 and 20. A distance between the lead terminal 110 and the lead terminal 120 is nearly comparable to the sum of the thickness of the semiconductor element 10 and thickness of the flexible wiring substrate 40. For example, the distance between the lead terminal 110 and the lead terminal 120 is 1 mm or less. In addition, the lead terminal 130 extends toward the X1 side as viewed from the semiconductor elements 10 and 20.

The electrode 12 of the semiconductor element 10 is electrically connected to the lead terminal 110. The electrodes 21 of the semiconductor element 20 are electrically connected to the lead terminal 120. The electrodes 11 of the semiconductor element 10 and the electrode 22 of the semiconductor element 20 are electrically connected to the lead terminal 130. That is, the wiring 61 of the wiring layer 45 and the electrode 22 of the semiconductor element 20 are electrically connected to each other through the electrically conductive member 30 and the lead terminal 130. Moreover, the lead terminal 140 is electrically connected to the electrode 23 of the semiconductor element 20. A lead terminal (not shown) is also connected to the wiring 63 of the wiring layer 45, and the lead terminal is electrically connected to the electrode 13 of the semiconductor element 10.

Figure 2:
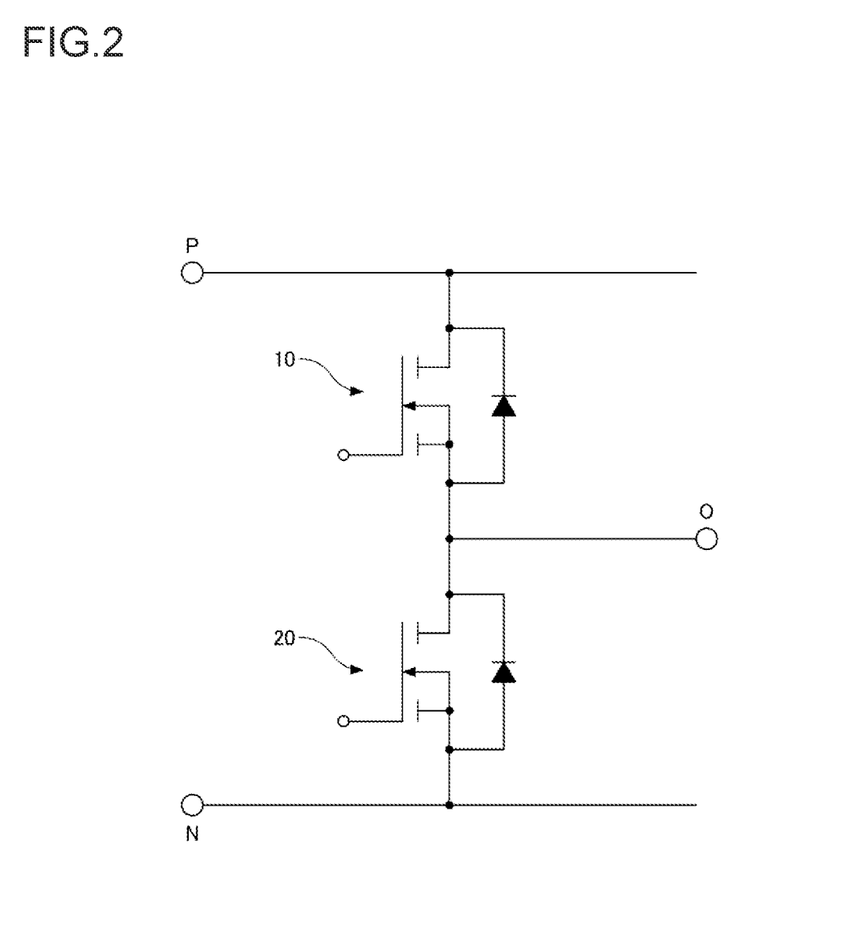
FIG. 2 is a circuit diagram showing the semiconductor device according to the first embodiment.

Here, a circuit configuration of the semiconductor device 1 according to the first embodiment will be described. FIG. 2 is a circuit diagram showing the semiconductor device according to the first embodiment.

As shown in FIG. 2, the electrode 12 of the semiconductor element 10 is electrically connected to a P terminal through the lead terminal 110. The electrodes 21 of the semiconductor element 20 are electrically connected to an N terminal through the lead terminal 120. Moreover, the electrodes 11 of the semiconductor element 10 and the electrode 22 of the semiconductor element 20 are electrically connected to an O terminal through the lead terminal 130. The P terminal is a positive input terminal, the N terminal is a negative input terminal, and the O terminal is an output terminal. Accordingly, a current flows in the lead terminal 110 in a direction opposite to a direction in which the current flows in the lead terminal 120.

[Method for Manufacturing Semiconductor Devices]

Next, a method for manufacturing the semiconductor devices according to the first embodiment will be described. FIGS. 3A to 3C, FIGS. 4A and 4B, FIGS. 5A and 5B, and FIGS. 6A and 6B are sectional views showing the method for manufacturing the semiconductor devices according to the first embodiment. In the following description, a so-called multiple-piece manufacturing method will be described. That is, a part corresponding to a large number of semiconductor devices 1 is produced by batch and then divided into individual pieces to manufacture the semiconductor devices 1. Incidentally, for convenience of explanation, portions that will finally become constituent elements of each of the semiconductor devices 1 will be designated by the same reference signs as those for the final constituent elements.

Figure 3A:
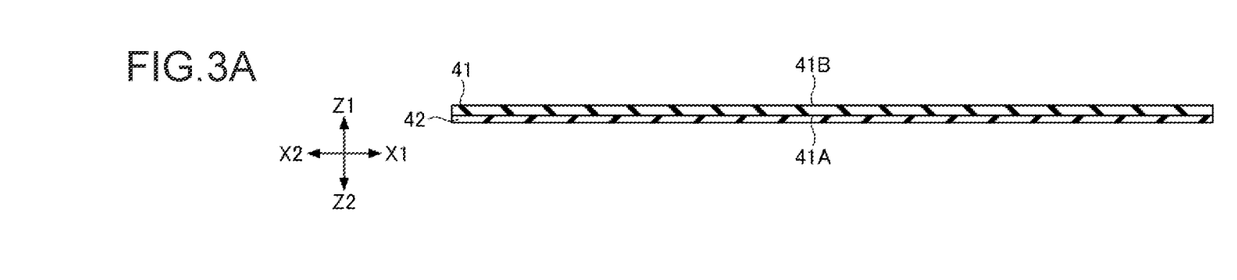
FIGS. 3A to 3C are sectional views showing a method for manufacturing each semiconductor device according to the first embodiment (Part 1)

First, as shown in FIG. 3A, a large-sized insulating base member 41 having one face 41A and the other face 41B is prepared. In the large-sized insulating base member 41, for example, a plurality of individual regions in each of which a semiconductor device 1 should be formed are consecutively provided in a matrix form. Here, the individual regions are regions each of which will be finally cut into an individual piece along predetermined cutting lines to form the individual semiconductor device 1. Incidentally, the number of the individual regions contained in the large-sized insulating base member 41 is not limited particularly. An insulating adhesive layer 42 that covers the entire face 41A of the insulating base member 41 is provided on the face 41A.

Figures 3B, 3C:
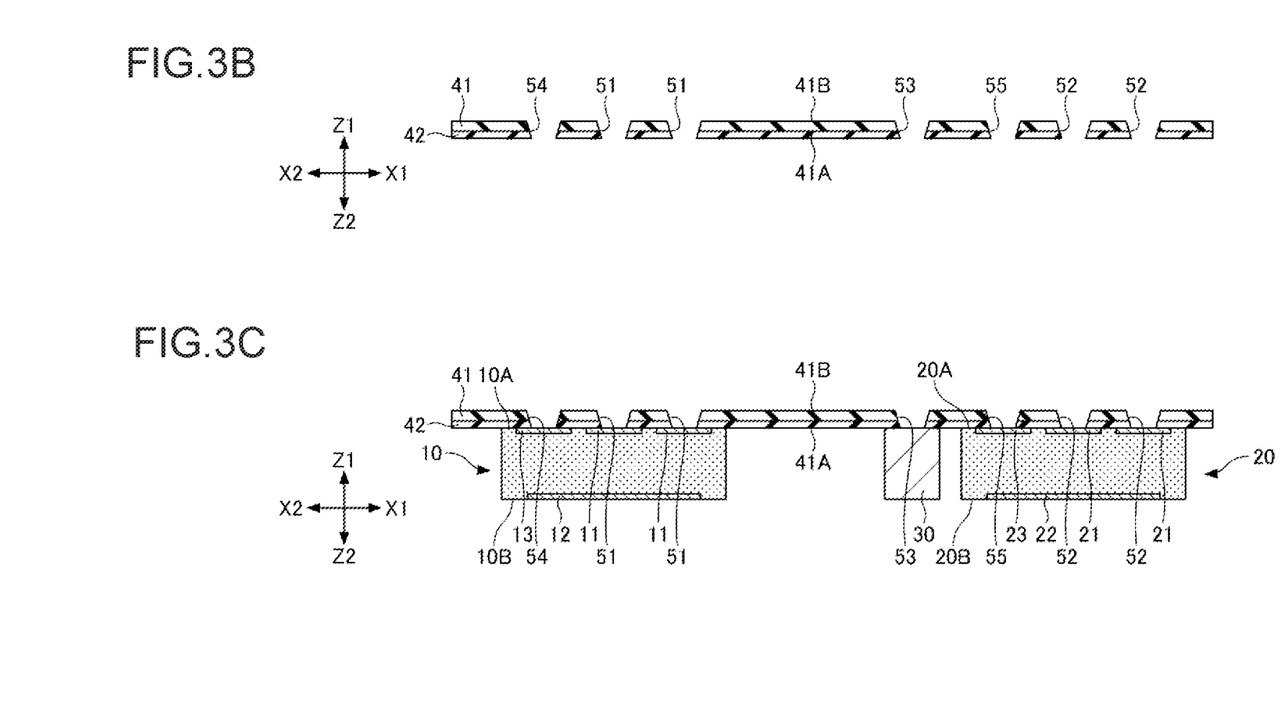

Next, as shown in FIG. 3B, through holes 51 to 55 are formed at required places in the insulating base member 41 and the adhesive layer 42 to penetrate through the insulating base member 41 and the adhesive layer 42 in a thickness direction. The through holes 51 to 55 can be formed, for example, by a laser machining method using a $CO_2$ laser, a UV-YAG laser, etc. or by a punching method. For example, the through holes 51 are formed on an X1 side of the through hole 54, the through hole 53 is formed on an X1 side of the through holes 51, the through hole 55 is formed on an X1 side of the through hole 53, and the through holes 52 are formed on an X1 side of the through hole 55.

Next, as shown in FIG. 3C, a semiconductor element 10, a semiconductor element 20, and an electrically conductive member 30 are adhesively bonded to the insulating base member 41 by the adhesive layer 42. On this occasion, alignment is performed to make one face 10A of the semiconductor element 10 face the face 41A of the insulating base member 41, so that electrodes 11 overlap with the through holes 51 and an electrode 13 overlaps with the through hole 54 in plan view. In addition, alignment is performed to make one face 20A of the semiconductor element 20 face the face 41A of the insulating base member 41, so that electrodes 21 overlap with the through holes 52 and an electrode 23 overlaps with the through hole 55 in plan view. Further, alignment is performed so that one face (Z1-side face) of the electrically conductive member 30 overlaps with the through hole 53 in plan view.

Figure 4A:
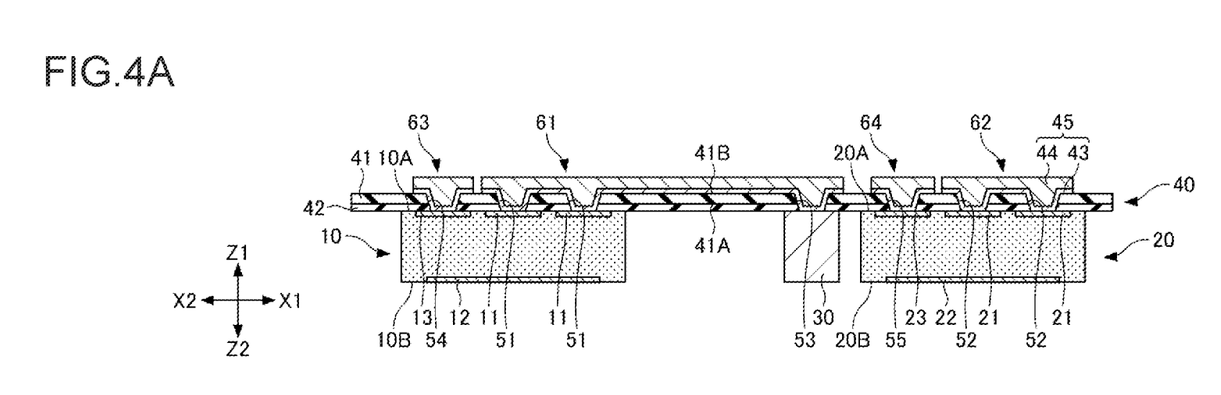
FIGS. 4A and 4B are sectional views showing the method for manufacturing the semiconductor device according to the first embodiment (Part 2)

Next, as shown in FIG. 4A, a wiring layer 45 including a seed layer 43 and a metal layer 44 is formed on the other face 41B of the insulating base member 41. The wiring layer can be formed, for example, by a semi-additive method.

Specifically, the seed layer 43 is formed to cover the entire other face 41B of the insulating base member 41 and entire inner faces of the through holes 51 to 55. The seed layer 43 can be formed, for example, by a sputtering method or an electroless plating method. In the case where, for example, the seed layer 43 is formed by the sputtering method, first, titanium is deposited by sputtering to form a Ti layer to thereby cover the other face 41B of the insulating base member 41 and the inner faces of the through holes 51 to 55. Then, copper is deposited on the Ti layer by sputtering to form a Cu layer. Thus, the seed layer 43 having a two-layer structure (the Ti layer/the Cu layer) can be formed. Moreover, in the case where the seed layer 43 is formed by the electroless plating method, for example, the seed layer 43 consisting of a Cu layer (one-layer structure) can be formed by an electroless copper plating method.

Next, a plating resist layer (not shown) is formed on the seed layer 43. The plating resist layer has opening portions provided in a portion where the wiring layer 45 should be formed, i.e. the portion where wirings 61 to 64 should be formed. Successively, the metal layer 44 made of copper or the like is formed in the opening portions of the plating resist layer by an electrolytic plating method using the seed layer 43 as a plating power feed path. Then, the plating resist layer is removed. Next, with the metal layer 44 used as a mask, the seed layer 43 is removed by wet etching. In this manner, the wiring layer 45 including the seed layer 43 and the metal layer 44 can be formed. The wiring layer 45 has the wirings 61 to 64. A flexible wiring substrate 40 is constituted by the insulating base member 41, the adhesive layer 42, and the wiring layer 45.

Figure 4B:
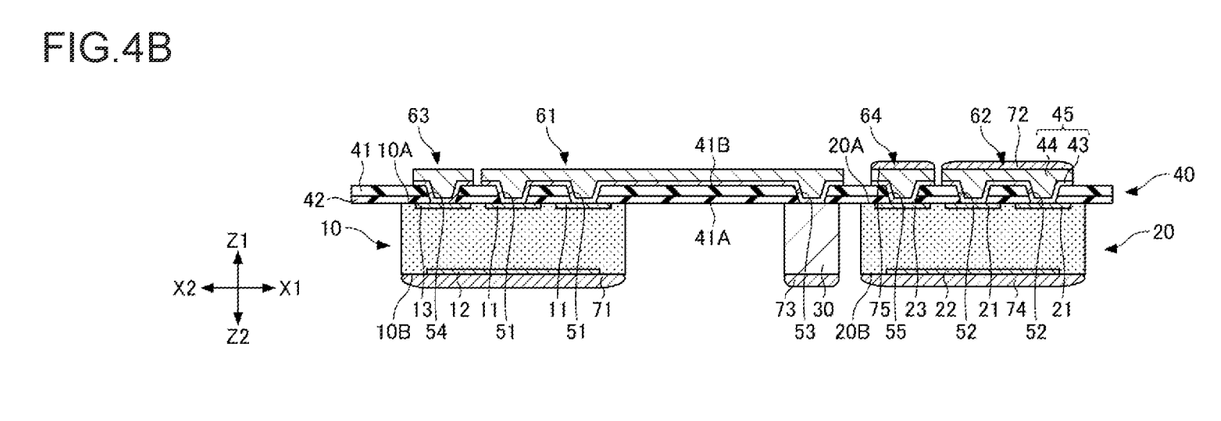

As shown in FIG. 4B, after the wiring layer 45 is formed, an electrically conductive adhesive layer 71 is provided on the other face 10B of the semiconductor element 10, an electrically conductive adhesive layer 73 is provided on the other face (Z2-side face) of the electrically conductive member 30, and an electrically conductive adhesive layer 74 is provided on the other face 20B of the semiconductor element 20. In addition, an electrically conductive adhesive layer 72 is provided on an upper face (Z1-side face) of the wiring 62 of the wiring layer 45, and an electrically conductive adhesive layer 75 is provided on an upper face (Z1-side face) of the wiring 64. The electrically conductive adhesive layers 71 to 75 are in an uncured state.

Figure 5A:
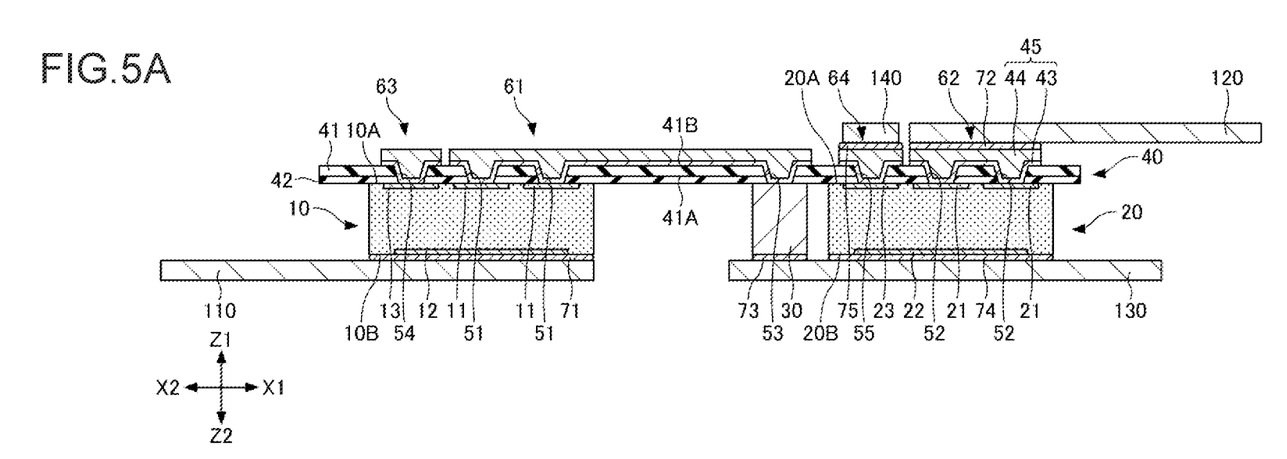
FIGS. 5A and 5B are sectional views showing the method for manufacturing the semiconductor device according to the first embodiment (Part 3)

Then, as shown in FIG. 5A, a lead terminal 110 is bonded to an electrode 12 by the electrically conductive adhesive layer 71, and a lead terminal 130 is bonded to the electrically conductive member 30 by the electrically conductive adhesive layer 73 and bonded to an electrode 22 by the electrically conductive adhesive layer 74. Moreover, a lead terminal 120 is bonded to the wiring 62 by the electrically conductive adhesive layer 72, and a lead terminal 140 is bonded to the wiring 64 by the electrically conductive adhesive layer 75. During the bonding, the electrically conductive adhesive layers 71 to 75 are cured.

Figure 5B:
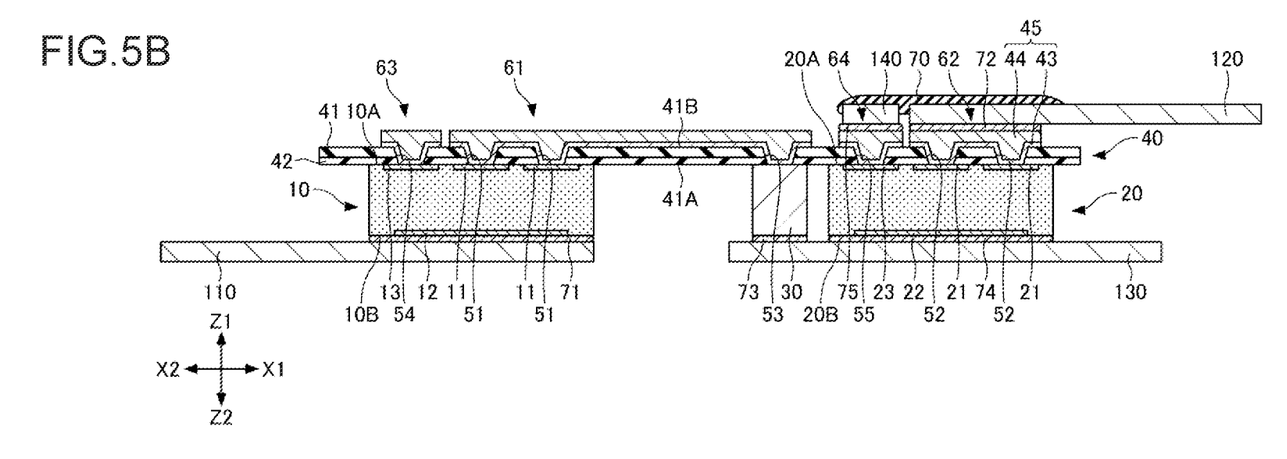

Next, as shown in FIG. 5B, an insulating adhesive layer 70 is provided on upper faces (Z1-side faces) of the wirings 62 and 64 of the wiring layer 45. More specifically, the insulating adhesive layer 70 is provided on upper faces of the lead terminals 120 and 140. The insulating adhesive layer 70 is, for example, provided so as to extend over the wirings 62 and 64. Especially, the insulating adhesive layer 70 is, for example, provided so as to extend over the lead terminals 120 and 140. The insulating adhesive layer 70 is in an uncured state.

Figure 6A:
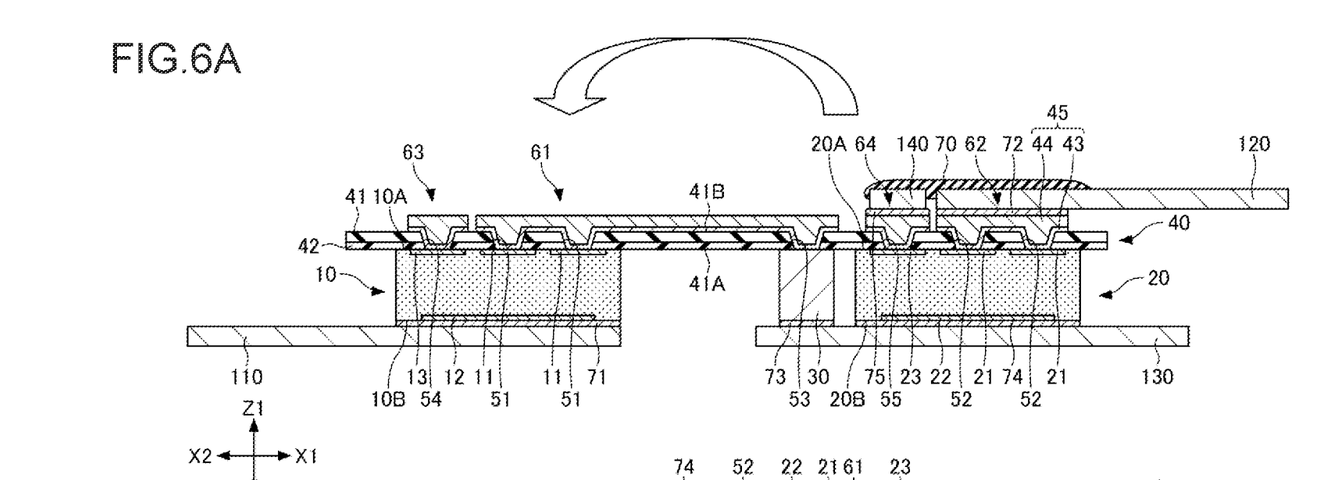
FIGS. 6A and 6B are sectional views showing the method for manufacturing the semiconductor device according to the first embodiment (Part 4)

Next, as shown in FIG. 6A, the flexible wiring substrate 40 is folded between the through holes 51 and the through hole 53 with one face 41A of the insulating base member 41 facing outside and the other face 41B of the insulating base member 41 facing inside.

Figure 6B:
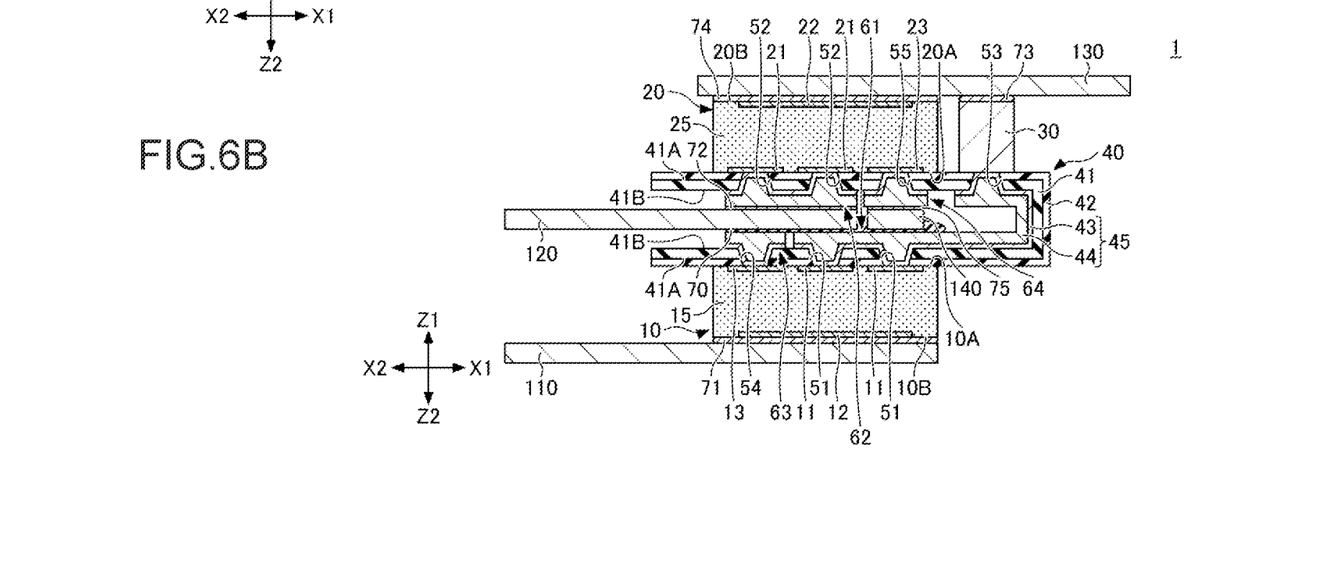

Then, as shown in FIG. 6B, the insulating adhesive layer 70 is pressed against and spread over the upper faces (Z1-side faces) of the wirings 61 and 63 of the wiring layer 45. Next, the insulating adhesive layer 70 is cured to fix the lead terminal 120 also to the wirings 61 and 63 of the wiring layer 45.

In this manner, the semiconductor device 1 according to the first embodiment can be manufactured. Incidentally, the large-sized insulating base member 41 can be divided, for example, before the electrically conductive adhesive layers 71 to 75 are provided (see FIG. 4B) after the formation of the wiring layer 45 (see FIG. 4A).

In the semiconductor device 1 according to the first embodiment, a current flows from a P terminal to an N terminal. Therefore, in the lead terminal 110, the current flows from the X2 side toward the X1 side, and in the lead terminal 120, the current flows from the X1 side toward the X2 side. Moreover, in the present embodiment, a distance between the lead terminal 110 and the lead terminal 120 is roughly defined by the sum of thickness of the semiconductor element 10 and thickness of the flexible wiring substrate 40. Thus, the distance between the lead terminal 110 and the lead terminal 120 becomes sufficiently small so that inductance between the lead terminal 110 and the lead terminal 120 can be reduced. Accordingly, it is possible to provide the semiconductor device 1 that can achieve high-speed switching operation.

Moreover, the wiring layer 45 can be formed on the other face 41B of the insulating base member 41 finely and with high accuracy by the semi-additive method. The wiring layer may be alternatively formed on the other face 41B of the insulating base member 41 by a subtractive method. Furthermore, the semiconductor elements 10 and 20 are adhesively bonded to the face 41A of the insulating base member 41 by the adhesive layer 42 so that the positions of the semiconductor elements 10 and 20 can be fixed to the insulating base member 41 and the wiring layer 45. Therefore, according to the present embodiment, it is possible to obtain excellent positional accuracy and connection reliability. Particularly, the semiconductor elements 10 and 20 can be aligned with high accuracy. Further, it is possible to secure high connection reliability between the semiconductor element 10 and the insulating base member 41, and it is possible to secure high connection reliability between the semiconductor element and the insulating base member 41.

Assume that a semiconductor device (power module) in which each of semiconductor elements is fixed to a metal foil (such as a copper foil) provided on the surface of an insulating substrate (such as a ceramic substrate) is manufactured as a reference example. In manufacturing such a semiconductor device, solder reflow is performed to fix the semiconductor element, so that the semiconductor element may be considerably misaligned during the reflow process. Therefore, a relatively large margin is required for the placement of the semiconductor element in a design phase.

On the other hand, in the present embodiment, the semiconductor elements 10 and 20 are adhesively bonded to the insulating base member 41 in which the through holes 51 to 55 have been formed, and the wiring layer 45 is formed by the semi-additive method. Therefore, excellent positional accuracy and connection reliability can be obtained so that large margins as in the reference example are not required.

Second Embodiment

Figure 7:
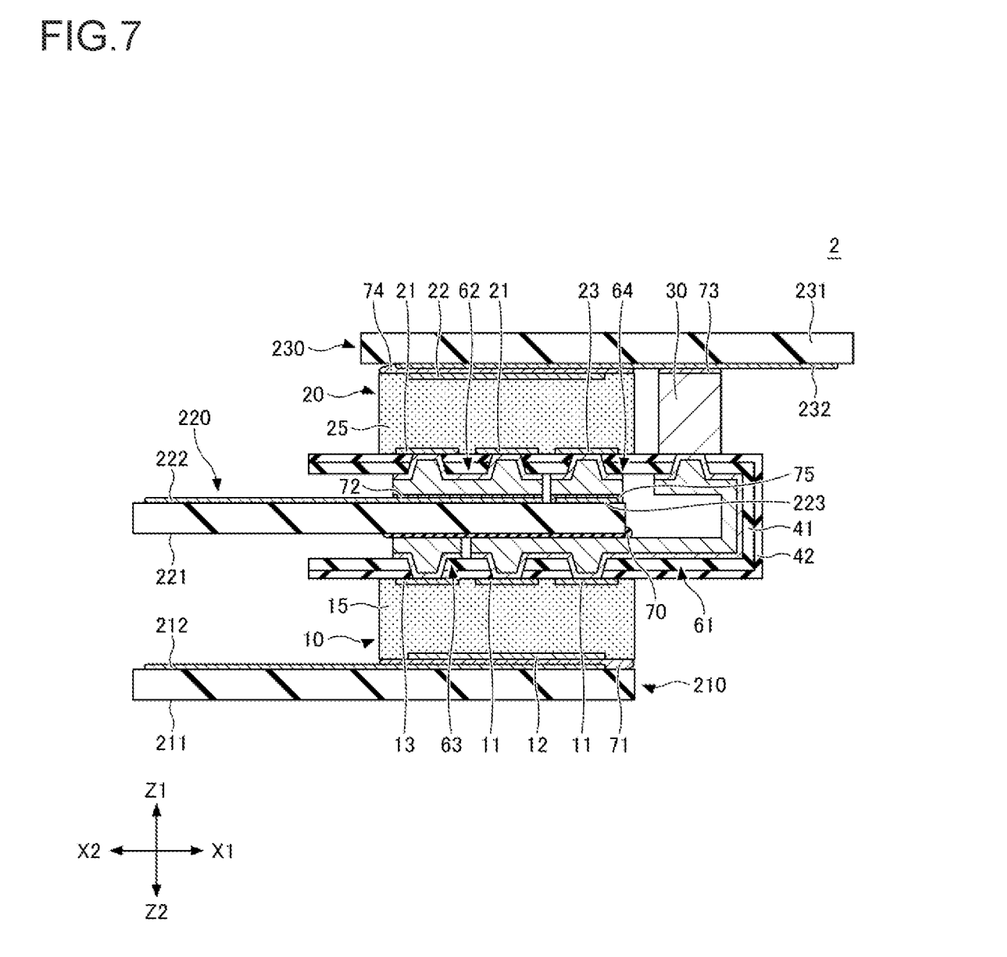
FIG. 7 is a sectional view showing a semiconductor device according to a second embodiment.

Next, a second embodiment will be described. FIG. 7 is a sectional view showing a semiconductor device according to the second embodiment.

As shown in FIG. 7, the semiconductor device 2 according to the second embodiment has a wiring substrate 210 in place of the lead terminal 110, has a wiring substrate 220 in place of the lead terminals 120 and 140, and has a wiring substrate 230 in place of the lead terminal 130. Each of the wiring substrates 210, 220, and 230 is an example of a wiring member.

The wiring substrate 210 has an insulating layer 211 and a wiring layer 212. The wiring layer 212 is provided on an upper face (Z1-side face) of the insulating layer 211. The material of the insulating layer 211 may be an inorganic material, may be an organic material, or may be a composite material. The material of the wiring layer 212 is, for example, copper or a copper alloy. The wiring layer 212 is bonded to an electrode 12 of a semiconductor element by an electrically conductive adhesive layer 71.

The wiring substrate 220 has an insulating layer 221, a wiring layer 222, and a wiring layer 223. The wiring layers 222 and 223 are provided on an upper face (Z1-side face) of the insulating layer 221. The material of the insulating layer 221 may be an inorganic material, may be an organic material, or may be a composite material. The material of the wiring layers 222 and 223 are, for example, copper or a copper alloy. The wiring layer 222 is bonded to a wiring 62 of a wiring layer 45 by an electrically conductive adhesive layer 72, and the wiring layer 223 is bonded to a wiring 64 of the wiring layer 45 by an electrically conductive adhesive layer 75. Moreover, the insulating layer 221 is bonded to wirings 61 and 63 of the wiring layer by an insulating adhesive layer 70.

The wiring substrate 230 has an insulating layer 231 and a wiring layer 232. The wiring layer 232 is provided on a Z2-side face of the insulating layer 231. The material of the insulating layer 231 may be an inorganic material, may be an organic material, or may be a composite material. The material of the wiring layer 232 is, for example, copper or a copper alloy. The wiring layer 232 is bonded to an electrically conductive member 30 by an electrically conductive adhesive layer 73, and bonded to an electrode 22 of a semiconductor element 20 by an electrically conductive adhesive layer 74.

The wiring substrate 210 includes a wiring layer (e.g. the wiring layer 212) that extends toward an X2 side as viewed from the semiconductor elements 10 and 20. The wiring substrate 220 includes a wiring layer (e.g. the wiring layer 222) that extends toward the X2 side as viewed from the semiconductor elements 10 and 20. In addition, the wiring substrate 230 includes a wiring layer (e.g. the wiring layer 232) extending toward an X1 side as viewed from the semiconductor elements 10 and 20.

The remaining configuration is the same as or similar to that in the first embodiment.

In order to manufacture the semiconductor device 2 according to the second embodiment, the wiring substrates 210, 220 and 230 are prepared in advance. Then, the wiring substrate 210 is provided in place of the lead terminal 110 and bonded to the semiconductor element 10, the wiring substrate 220 is provided in place of the lead terminals 120 and 140 and bonded to the wiring layer 45, and the wiring substrate 230 is provided in place of the lead terminal 130 and bonded to the semiconductor element 20 and the electrically conductive member 30. In this manner, the semiconductor device 2 can be manufactured.

In the semiconductor device 2 according to the second embodiment, a current flows from a P terminal toward an N terminal. Therefore, the current flows from the X2 side toward the X1 side in the wiring substrate 210, and flows from the X1 side toward the X2 side in the wiring substrate 220. In addition, in the present embodiment, a distance between the wiring substrate 210 and the wiring substrate 220 is roughly defined by the sum of thickness of the semiconductor element 10 and thickness of a flexible wiring substrate 40. Thus, the distance between the wiring substrate 210 and the wiring substrate 220 (more specifically, the distance in the Z1-Z2 direction between the wiring layer 212 and the wiring layer 222) becomes sufficiently small so that inductance between the wiring substrate 210 and the wiring substrate 220 can be reduced. Accordingly, it is possible to provide the semiconductor device 2 that can achieve high-speed switching operation.

As with the first embodiment, the semiconductor elements 10 and 20 are adjacently bonded to an insulating base member 41 where through holes 51 to 55 have been formed, and the wiring layer 45 is formed by a semi-additive method. Therefore, excellent positional accuracy and connection reliability can be obtained.

Third Embodiment

Next, a third embodiment will be described.
[Configuration of Semiconductor Device]

Figure 8:
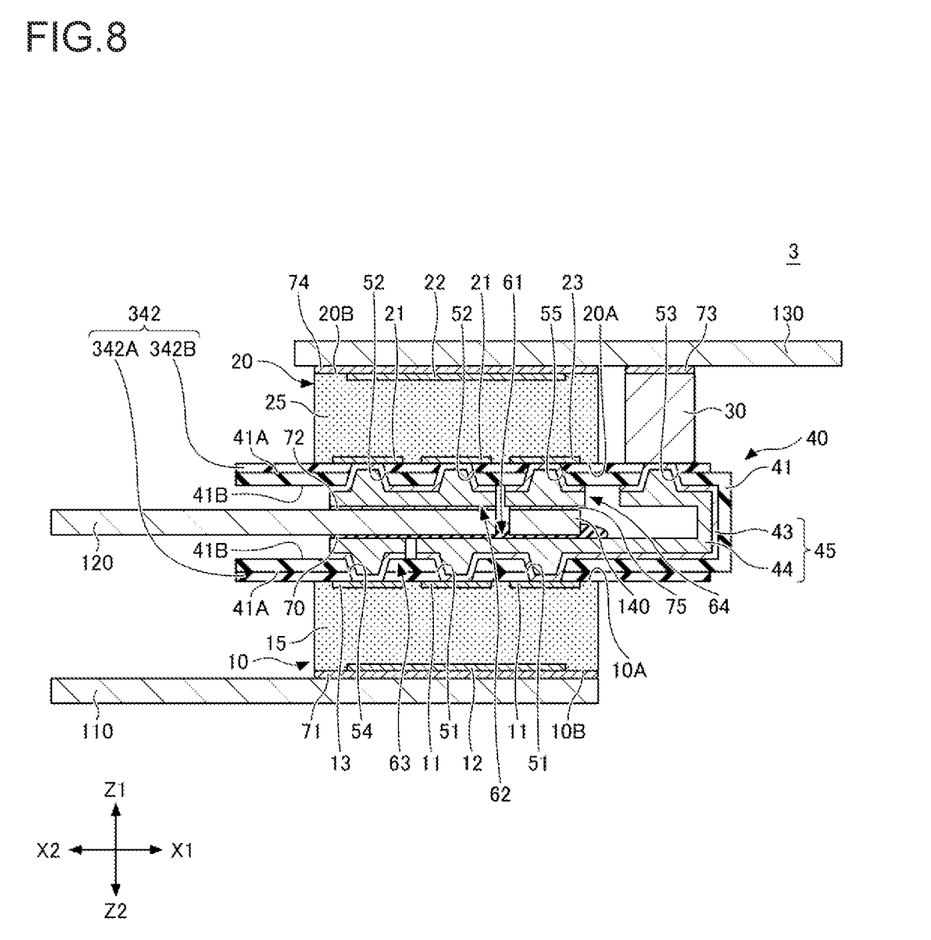
FIG. 8 is a sectional view showing a semiconductor device according to a third embodiment.

First, a sectional configuration of a semiconductor device according to the third embodiment will be described. FIG. 8 is a sectional view showing the semiconductor device according to the third embodiment.

As shown in FIG. 8, the semiconductor device 3 according to the third embodiment has an adhesive layer 342 in place of the adhesive layer 42. The adhesive layer 342 is provided on one face 41A of an insulating base member 41 in a manner the same as or similar to the adhesive layer 42. The material and thickness of the adhesive layer 342 are the same as or similar to the material and thickness of the adhesive layer 42.

The adhesive layer 342 has an adhesive portion 342A that adhesively bonds a semiconductor element 10 to the face 41A, and an adhesive portion 342B that adhesively bonds a semiconductor element 20 to the face 41A. The face 41A at a portion where the insulating base member 41 is folded is exposed from the adhesive layer 342 between the adhesive portion 342A and the adhesive portion 342B.

The remaining configuration is the same as or similar to that in the first embodiment.
[Method for Manufacturing Semiconductor Devices]

Figure 9A:
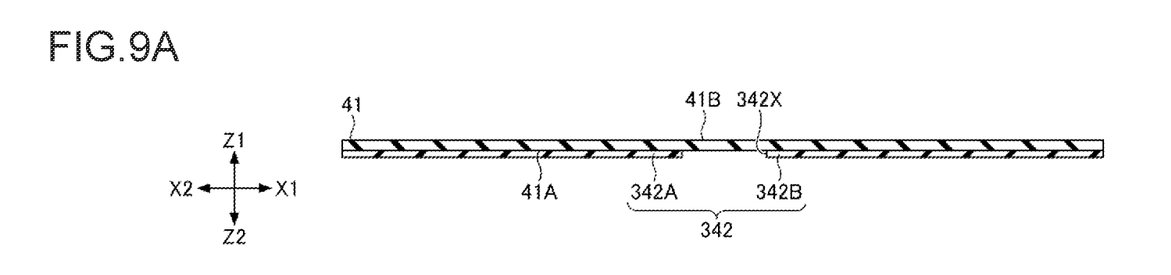
FIGS. 9A to 9C are sectional views showing a method for manufacturing each semiconductor device according to the third embodiment.
Figure 9B:
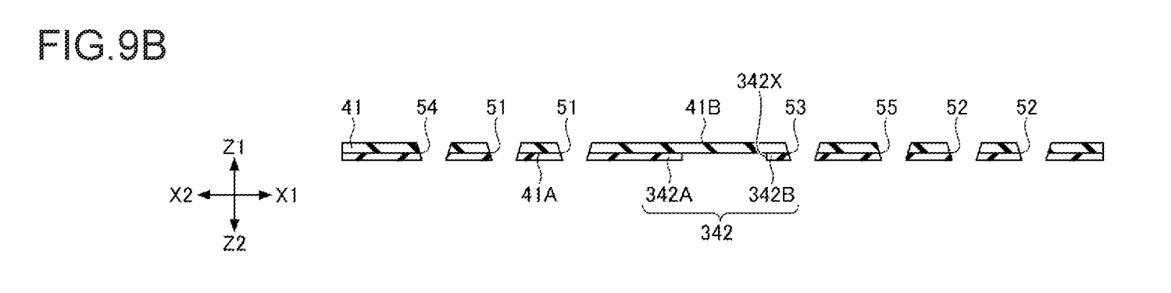
Figure 9C:
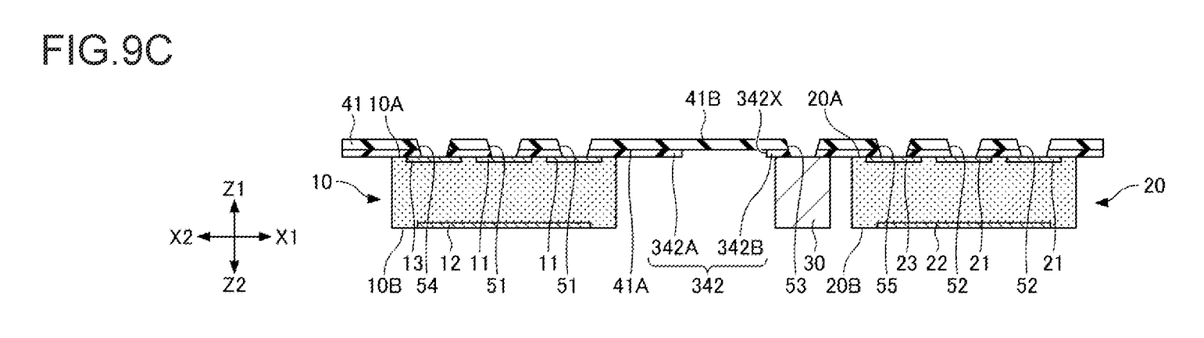

Next, a method for manufacturing the semiconductor devices according to the third embodiment will be described. FIGS. 9A to 9C are sectional views showing the method for manufacturing the semiconductor devices according to the third embodiment. In the following description, a so-called multiple-piece manufacturing method will be described. That is, a part corresponding to a large number of semiconductor devices 3 is produced by batch and then divided into individual pieces to manufacture the semiconductor devices 3. Incidentally, for convenience of explanation, portions that will finally become constituent elements of each of the semiconductor devices 3 will be designated by the same reference signs as those for the final constituent elements.

First, as shown in FIG. 9A, a large-sized insulating base member 41 having one face 41A and the other face 41B is prepared in a manner the same as or similar to that in the first embodiment. However, an insulating adhesive layer 342 that includes an adhesive portion 342A and an adhesive portion 342B, and in which an opening portion 342X is formed between the adhesive portion 342A and the adhesive portion 342B is provided in place of the adhesive layer 42 on the face 41A of the insulating base member 41. The opening portion 342X can be, for example, formed by punching out the adhesive layer.

Next, as shown in FIG. 9B, through holes 51 to 55 are formed at required places in the insulating base member 41 and the adhesive layer 342 to penetrate through the insulating base member 41 and the adhesive layer 42 in a thickness direction.

Next, as shown in FIG. 9C, a semiconductor element 10, a semiconductor element 20 and an electrically conductive member 30 are adhesively bonded to the insulating base member 41 by the adhesive layer 342. On this occasion, the semiconductor element 10 is adhesively bonded to the insulating base member 41 by the adhesive portion 342A, and the semiconductor element 20 and the electrically conductive member 30 are adhesively bonded to the insulating base member 41 by the adhesive portion 342B. In addition, alignment the same as or similar to that in the first embodiment is performed.

Then, a step of forming a wiring layer 45 including a seed layer 43 and a metal layer 44 and subsequent steps are performed in a manner the same as or similar to that in the first embodiment. In this manner, the semiconductor device 3 according to the third embodiment can be manufactured.

Effects the same as or similar to those in the first embodiment can be also obtained by the third embodiment. Furthermore, the face 41A at a portion where the insulating base member 41 is folded is exposed from the adhesive layer 342 between the adhesive portion 342A and the adhesive portion 342B. Therefore, the adhesive layer 342 does not include any folded portion formed in association with the folding of the insulating base member 41. Even if the adhesive layer 342 includes such a folded portion, the range of the folded portion is narrower than that in the first embodiment. In the first embodiment, depending on the material of the adhesive layer 42, toughness of the cured adhesive layer 42 may be low enough to cause cracking in the adhesive layer 42 when the adhesive layer 42 is folded. When the cracking occurs in the adhesive layer 42, there is a possibility that the adhesive layer 42 may peel from the insulating base member 41, or the semiconductor element 10, the semiconductor element or the electrically conductive member 30 may peel from the insulating base member 41. In contrast, in the third embodiment, the adhesive layer 342 is hardly folded. Therefore, the cured adhesive layer 342 can be prevented from easily cracking even in the case where toughness of the adhesive layer 342 is low.

Fourth Embodiment

Figure 10:
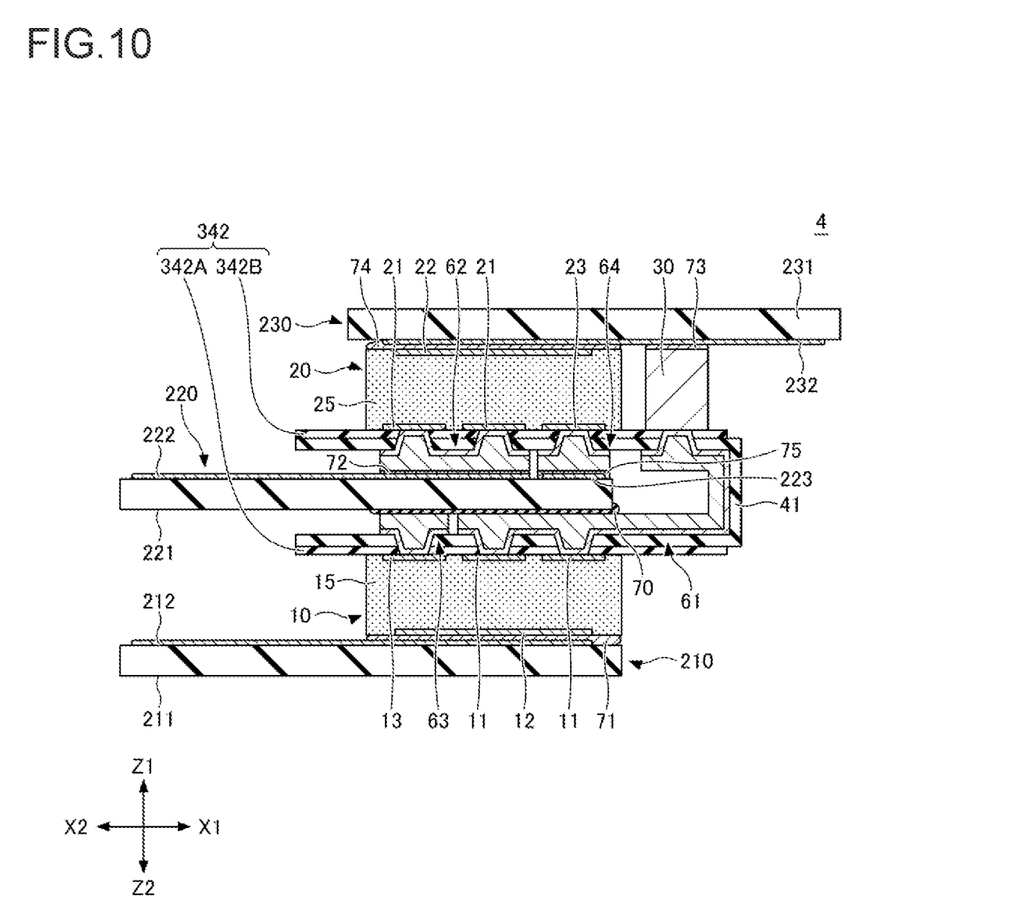
FIG. 10 is a sectional view showing a semiconductor device according to a fourth embodiment.

Next, a fourth embodiment will be described. FIG. 10 is a sectional view showing a semiconductor device according to the fourth embodiment.

As shown in FIG. 10, the semiconductor device 4 according to the fourth embodiment has a wiring substrate 210 in place of the lead terminal 110, has a wiring substrate 220 in place of the lead terminals 120 and 140, and has a wiring substrate 230 in place of the lead terminal 130, in a manner the same as or similar to that in the second embodiment.

The remaining configuration is the same as or similar to that in the third embodiment.

According to the fourth embodiment, effects the same as or similar to those in the second embodiment and the third embodiment can be obtained.

Incidentally, the configuration of each of the wiring substrates is not limited to the aforementioned one, but a ceramic substrate, a build-up substrate, or the like may be used. The wiring substrate is not limited to a single-layer structure, but may be, for example, embodied in a laminate structure in which one or more wiring layers and a plurality of insulating layers are deposited. The wiring layers may be provided in both the front and back faces.

Moreover, the lead terminals 110, 120 and 130 and the wiring substrates 210, 220 and 230 may be combined with each other respectively to configure the semiconductor device. For example, configuration may be made so that the lead terminal 120 is replaced by the wiring substrate 220 in FIG. 1.

Although the preferred embodiments have been described above in detail, the present disclosure is not limited to the above-described embodiments, but various modifications and substitutions can be made on the above-described embodiments without departing from the scope described in Claims.

What is claimed is:

1. A semiconductor device comprising:
a first semiconductor element comprising a first face and a second face opposite to the first face, wherein a first electrode is provided in the first face and a second electrode is provided in the second face;
a second semiconductor element comprising a third face and a fourth face opposite to the third face, wherein a third electrode is provided in the third face and a fourth electrode is provided in the fourth face;
an insulating base member comprising a fifth face and a sixth face opposite to the fifth face, wherein the first face of the first semiconductor element and the third face of the second semiconductor element are adhesively bonded to the fifth face;
a first wiring that penetrates through the insulating base member to be electrically connected to the first electrode, and that is disposed on the sixth face of the insulating base member;
a second wiring that penetrates through the insulating base member to be electrically connected to the third electrode, and that is disposed on the sixth face of the insulating base member;
a first wiring member that faces the second face of the first semiconductor element, and that is electrically connected to the second electrode; and
a second wiring member electrically connected to the second wiring and comprising a seventh face and an eighth face opposite to the seventh face, wherein the seventh face of the second wiring member faces the sixth face of the insulating base member,
wherein:
the second wiring member is bonded to both the first wiring and the second wiring in a state where the insulating base member is folded;
the first wiring member and the second wiring member face each other, and are electrically connected to each other; and
a current flows in a first direction in the first wiring member, and flows in a second direction opposite to the first direction in the second wiring member.

2. The semiconductor device according to claim 1, wherein:
the first wiring member is electrically connected to the second wiring member through the first semiconductor element, the first wiring, the second semiconductor element and the second wiring.

3. The semiconductor device according to claim 1, wherein:
the insulating base member has flexibility.

4. The semiconductor device according to claim 1, further comprising:
a first electrically conductive adhesive layer that bonds the first wiring member and the second electrode to each other; and
a second electrically conductive adhesive layer that bonds the second wiring member and the second wiring to each other.

5. The semiconductor device according to claim 1, further comprising:
a first insulating adhesive layer that bonds the second wiring member and the first wiring to each other.

6. The semiconductor device according to claim 1, wherein:
the first wiring member comprises a first lead terminal; and the second wiring member comprises a second lead terminal.

7. The semiconductor device according to claim 1, wherein:
the first wiring member comprises a first wiring substrate; and
the second wiring member comprises a second wiring substrate.

8. The semiconductor device according to claim 1, further comprising:
an electrically conductive member that is adhesively bonded to the fifth face; and
a third wiring member that is provided on the fourth face of the second semiconductor element to be electrically connected to the electrically conductive member and the fourth electrode,
wherein the first wiring penetrates through the insulating base member to be electrically connected to the electrically conductive member.

9. The semiconductor device according to claim 8, further comprising:
a third electrically conductive adhesive layer that bonds the third wiring member and the electrically conductive member to each other; and
a fourth electrically conductive adhesive layer that bonds the third wiring member and the fourth electrode to each other.

10. The semiconductor device according to claim 8, wherein:
the third wiring member comprises a third lead terminal.

11. The semiconductor device according to claim 8, wherein:
the third wiring member comprises a third wiring substrate.

12. The semiconductor device according to claim 1, wherein:
the first semiconductor element further comprises a fifth electrode provided in the first face;
the second semiconductor element further comprises a sixth electrode provided in the third face; and
the semiconductor device further comprises:
a third wiring that penetrates through the insulating base member to be electrically connected to the fifth electrode, and that is disposed on the sixth face of the insulating base member; and
a fourth wiring that penetrates through the insulating base member to be electrically connected to the sixth electrode, and that is disposed on the sixth face of the insulating base member.

13. The semiconductor device according to claim 1, further comprising:
a second insulating adhesive layer that is provided on the fifth face of the insulating base member.

14. The semiconductor device according to claim 13, wherein:
the second insulating adhesive layer comprises:
a first adhesive portion that adhesively bonds the first semiconductor element to the fifth face, and
a second adhesive portion that adhesively bonds the second semiconductor element to the fifth face;
the fifth face is exposed from the second insulating adhesive layer between the first adhesive portion and the second adhesive portion; and
the insulating base member is folded between the first adhesive portion and the second adhesive portion.

* * * * *